(12) United States Patent
Cho et al.

(10) Patent No.: US 8,815,692 B2
(45) Date of Patent: Aug. 26, 2014

(54) THIN FILM TRANSISTOR ARRAY SUBSTRATE AND METHOD FOR MANUFACTURING THE SAME

(71) Applicant: LG Display Co., Ltd., Seoul (KR)

(72) Inventors: Yongsoo Cho, Daegu (KR); Kyoho Moon, Daegu (KR); Byungyong Ahn, Gyeonggi-do (KR); Chanki Ha, Incheon (KR)

(73) Assignee: LG Display Co., Ltd., Seoul (KR)

( * ) Notice: Subject to any disclaimer, the term of this patent is extended or adjusted under 35 U.S.C. 154(b) by 4 days.

(21) Appl. No.: 13/772,454

(22) Filed: Feb. 21, 2013

(65) Prior Publication Data
US 2013/0221359 A1 Aug. 29, 2013

(30) Foreign Application Priority Data
Feb. 29, 2012 (KR) .......... 10-2012-0020840

(51) Int. Cl.
*H01L 21/336* (2006.01)
*H01L 21/02* (2006.01)
(52) U.S. Cl.
USPC .......................................... 438/287; 257/411

(58) Field of Classification Search
USPC ............ 438/149, 216, 287, 591; 257/57, 411, 257/E21.094–E21.121
See application file for complete search history.

(56) References Cited

U.S. PATENT DOCUMENTS

| 5,365,875 A * | 11/1994 | Asai et al. ..................... 438/487 |
| 5,962,896 A * | 10/1999 | Yabuta et al. ................. 257/347 |
| 6,600,524 B1 * | 7/2003 | Ando et al. .................... 349/43 |
| 2003/0090603 A1* | 5/2003 | Chae et al. ...................... 349/43 |

* cited by examiner

*Primary Examiner* — Calvin Lee
(74) *Attorney, Agent, or Firm* — Morgan, Lewis & Bockius LLP (57) ABSTRACT

A thin film transistor array substrate having excellent characteristics and a method for manufacturing the same are disclosed. The thin film transistor array substrate includes a substrate, a gate electrode positioned on the substrate, a gate insulating layer positioned on the gate electrode, an active layer which is positioned on the gate insulating layer and includes a channel, an ohmic contact layer positioned on the active layer, and a source electrode and a drain electrode which are respectively connected to both sides of the active layer through the ohmic contact layer. The gate insulating layer includes a phosphorus-doped layer positioned adjacent to the active layer.

15 Claims, 9 Drawing Sheets

THIN FILM TRANSISTOR ARRAY SUBSTRATE AND METHOD FOR MANUFACTURING THE SAME

This application claims the priority benefit of Korean Patent Application No. 10-2012-0020840 filed on Feb. 29, 2012, which is incorporated herein by reference for all purposes as if fully set forth herein.

BACKGROUND OF THE INVENTION

1. Field of the Invention

Embodiments of the invention relate to a thin film transistor array substrate having excellent characteristics through a reduction in an off-current and a method for manufacturing the same.

2. Discussion of the Related Art

The importance of flat panel displays is recently increasing with the growth of multimedia. Thus, various types of flat panel displays such as liquid crystal displays (LCDs), plasma display panels (PDPs), field emission displays (FEDs), and organic light emitting diode (OLED) displays have been put to practical use.

Out of the flat panel displays, the liquid crystal display has visibility, which is better than a cathode ray tube (CRT), and average power consumption and an amount of light generated, which are less than the cathode ray tube (CRT). Further, because the OLED display has a fast response time of 1 ms or less, low power consumption, and a self-emitting structure, there is no problem in a viewing angle of the OLED display. Thus, the OLED display has been considered as a next generation display.

An active matrix liquid crystal display using thin film transistors is driven by a voltage held by capacitances of the thin film transistors, which are connected to pixel electrodes. In addition to basic characteristics of the thin film transistor including a mobility, a leakage current, etc., durability and electrical reliability capable of maintaining long lifespan are very important in the thin film transistor of the active matrix liquid crystal display.

The thin film transistor includes a gate electrode, an active layer, a source electrode, and a drain electrode. The active layer is formed of amorphous silicon or polycrystalline silicon. Amorphous silicon mainly used to form the active layer has the advantage of a simple formation process. Hence, the manufacturing cost of the active layer may be reduced. However, a behavior of electrons and a behavior of holes are not free because of characteristic of amorphous silicon, in which the Fermi level exists in the middle of an energy gap. Hence, a leakage current resulting from a hole current increases in an off-region. As a result, a crosstalk is generated in an image, and a reduction in the image quality, for example, a spot is generated.

SUMMARY OF THE INVENTION

Embodiments of the invention provide a thin film transistor array substrate capable of improving image quality by reducing a leakage current and a method for manufacturing the same.

In one aspect, there is a thin film transistor array substrate including a substrate, a gate electrode positioned on the substrate, a gate insulating layer positioned on the gate electrode, an active layer positioned on the gate insulating layer, the active layer including a channel, an ohmic contact layer positioned on the active layer, and a source electrode and a drain electrode which are respectively connected to both sides of the active layer through the ohmic contact layer, wherein the gate insulating layer includes a phosphorus-doped layer positioned adjacent to the active layer.

In another aspect, there is a method for manufacturing a thin film transistor array substrate including forming a gate electrode on a substrate, forming a gate insulating layer on the gate electrode, doping phosphorus (P) on the gate insulating layer to form a phosphorus-doped layer, forming an active layer and an ohmic contact layer on the gate insulating layer, and forming a source electrode and a drain electrode which are respectively connected to both sides of the active layer through the ohmic contact layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
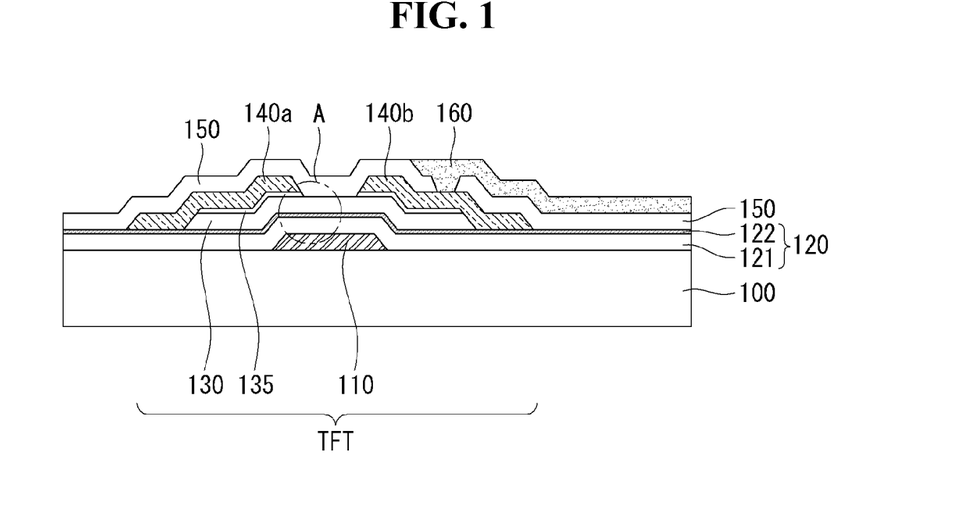
FIG. 1 is a cross-sectional view of a thin film transistor array substrate according to an example embodiment of the invention.
Figure 2:
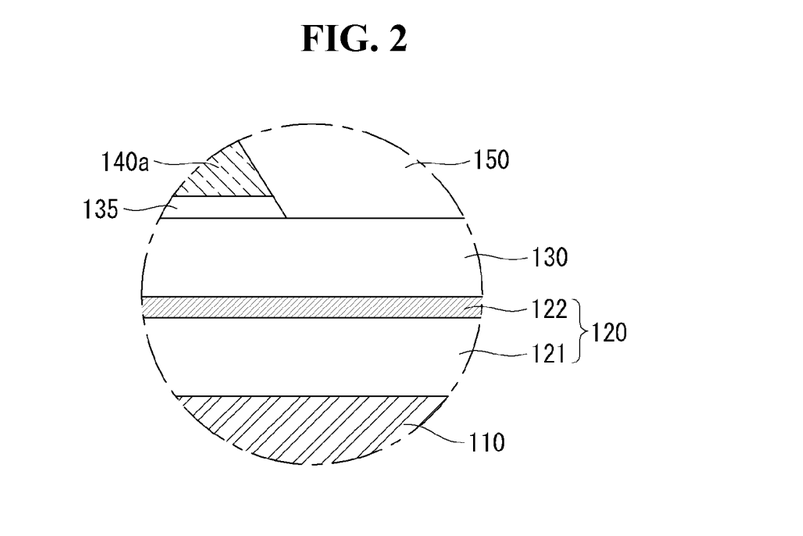
FIG. 2 is an enlarged view of an area "A" of FIG. 1.

FIG. 1 is a cross-sectional view of a thin film transistor array substrate according to an example embodiment of the invention. FIG. 2 is an enlarged view of an area "A" of FIG. 1.

As shown in FIG. 1, a thin film transistor (TFT) array substrate according to the embodiment of the invention includes a substrate 100, a gate electrode 110 positioned on the substrate 100, a gate insulating layer 120 for insulating the gate electrode 110, an active layer 130 positioned on the gate insulating layer 120, an ohmic contact layer 135 positioned on the active layer 130, and a source electrode 140*a* and a drain electrode 140*b* respectively connected to both sides of the active layer 130 through the ohmic contact layer 135.

More specifically, the substrate 100 is formed of transparent glass, plastic, or metal, and the gate electrode 110 is positioned on the substrate 100.

The gate insulating layer 120 is positioned on the gate electrode 110 to insulate the gate electrode 110. The gate insulating layer 120 includes an insulating layer 121 and a phosphorus-doped layer 122. The insulating layer 121 is formed of silicon nitride or silicon oxide, and the phosphorus-doped layer 122 is formed by doping the silicon nitride layer or the silicon oxide layer (i.e., the insulating layer 121) with phosphorus (P). The phosphorus-doped layer 122 contacts the surface of the gate insulating layer 120, and the insulating layer 121 is formed under the phosphorus-doped layer 122 and constitutes the gate insulating layer 120.

The active layer 130 is positioned on the gate insulating layer 120, and the ohmic contact layer 135 is positioned on the active layer 130. The active layer 130 is a semiconductor layer having a channel and is formed of amorphous silicon. The ohmic contact layer 135 reduces a contact resistance between the active layer 130 and the source and drain electrodes 140a and 140b and is formed of n$^+$-type amorphous silicon.

The source electrode 140a and the drain electrode 140b are respectively connected to both sides of the active layer 130 through the ohmic contact layer 135. As shown in FIG. 1, the source electrode 140a and the drain electrode 140b may respectively cover both ends of the active layer 130. Alternatively, the source electrode 140a and the drain electrode 140b may contact only the ohmic contact layer 135. The structure of each of the source electrode 140a and the drain electrode 140b is not particularly limited.

A passivation layer 150 is positioned to cover a thin film transistor including the gate electrode 110, the active layer 130, the source electrode 140a, and the drain electrode 140b. A pixel electrode 160 passes through the passivation layer 150 and is connected to one of the source electrode 140a and the drain electrode 140b.

As shown in FIG. 2, because the phosphorus-doped layer 122 included in the gate insulating layer 120 is formed through the doping of phosphorus, phosphorus is distributed into the surface of the gate insulating layer 120 at a predetermined concentration. In particular, the phosphorus-doped layer 122 contacts the active layer 130 and thus affects a hole current of the active layer 130.

In general, the generation and the flow of carriers at an interface between the gate insulating layer 120 and the active layer 130 are determined depending on characteristics of a material. In the embodiment of the invention, the interface (i.e., the surface of the gate insulating layer 120) between the gate insulating layer 120 and the active layer 130 is doped with phosphorus (P) to form the phosphorus-doped layer 122, so as to reduce the flow of holes in the active layer 130. Thus, the phosphorus-doped layer 122 does not obstruct the flow of electrons and obstructs the flow of holes. Hence, an off-current may be reduced, and an on/off current ratio may increase.

Figure 3A:
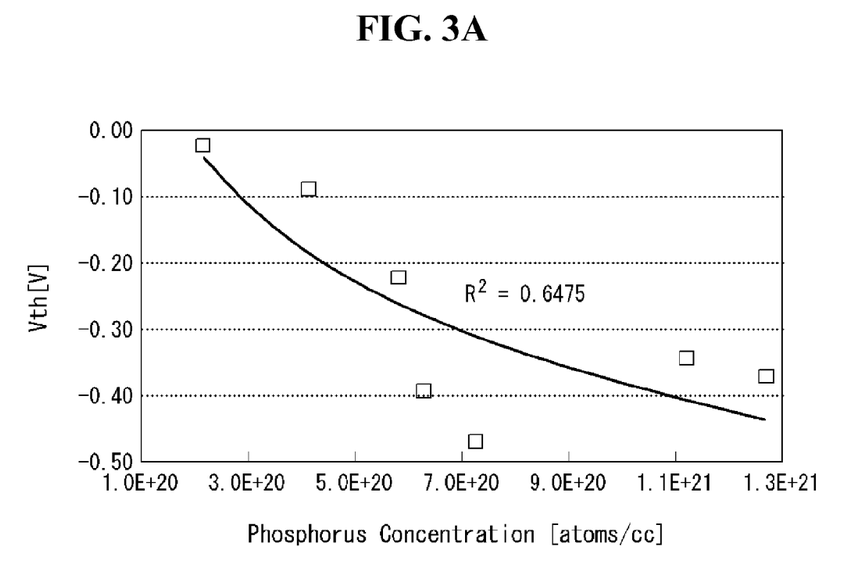
FIG. 3A is a graph indicating a threshold voltage depending on a doping concentration of phosphorus (P)
Figure 3B:
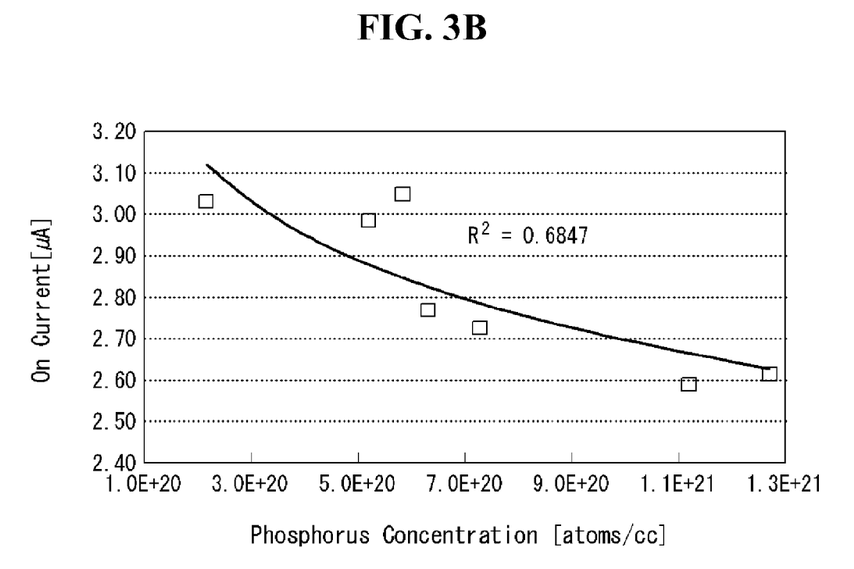
FIG. 3B is a graph indicating an on-current depending on a doping concentration of phosphorus (P)
Figure 4:
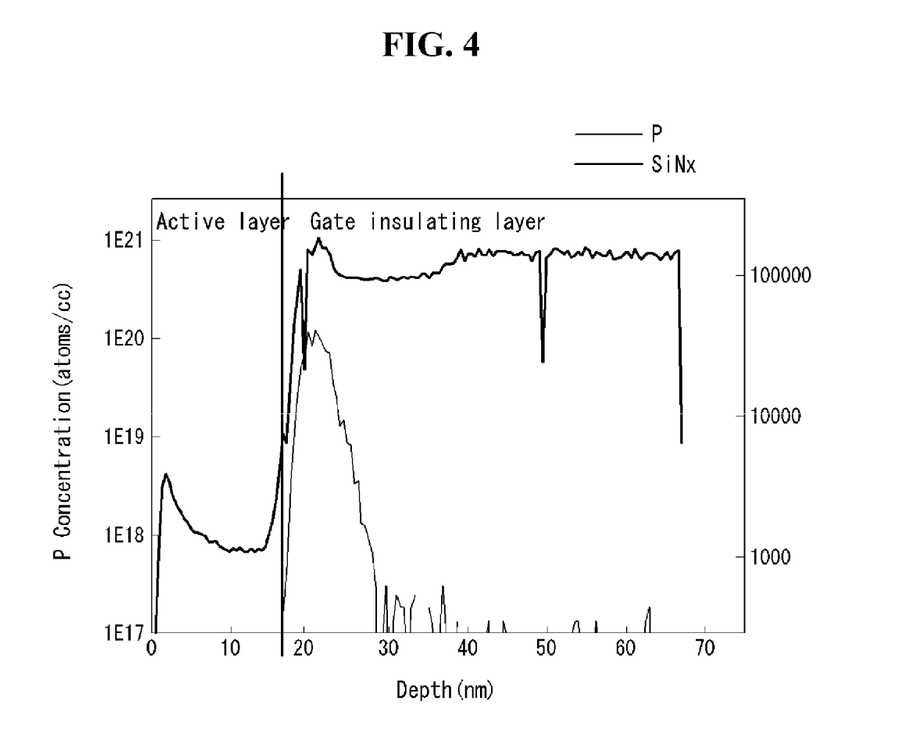
FIG. 4 is a graph indicating a concentration of phosphorus (P) contained in each of an active layer and a gate insulating layer.

FIG. 3A is a graph indicating a threshold voltage depending on a doping concentration of phosphorus (P), and FIG. 3B is a graph indicating an on-current depending on a doping concentration of phosphorus (P). FIG. 4 is a graph indicating a concentration of phosphorus (P) contained in each of the active layer and the gate insulating layer.

A doping concentration of phosphorus (P) contained in the phosphorus-doped layer 122 greatly depends on electrical characteristics of the thin film transistor. As shown in FIG. 3A, as the doping concentration of phosphorus (P) increases, a threshold voltage decreases. As shown in FIG. 3B, as the doping concentration of phosphorus (P) decreases, an on-current increases.

Accordingly, in the embodiment of the invention, the doping concentration of phosphorus (P) contained in the phosphorus-doped layer 122 may be about $10^{17}$ to $10^{21}$/cm3. When the doping concentration of phosphorus (P) is equal to or less than about $10^{21}$/cm3, a reduction in the characteristics of the thin film transistor, including a reduction in the on-current, the hanging of a subthreshold slope, etc., may be prevented. Further, when the doping concentration of phosphorus (P) is equal to or greater than about $10^{17}$/cm3, an off-current may decrease.

As shown in FIG. 4, a thickness of the phosphorus-doped layer 122 is equal to or less than about 300 Å measured from the surface of the gate insulating layer 120. Because the phosphorus-doped layer 122 is formed through a plasma treatment, much time and cost are spent to deeply dope the surface of the gate insulating layer 120 with phosphorus (P). Thus, it is preferable, but not required, the thickness of the phosphorus-doped layer 122 is equal to or less than about 300 Å measured from the surface of the gate insulating layer 120.

Figure 5A:
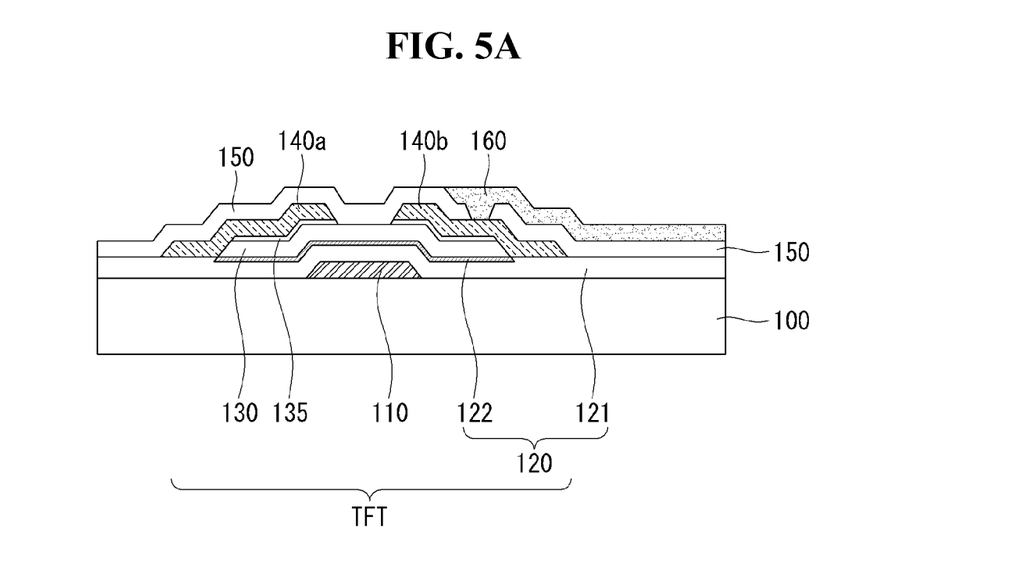
FIGS. 5A and 5B illustrate a structure of a phosphorus-doped layer according to an example embodiment of the invention.
Figure 5B:
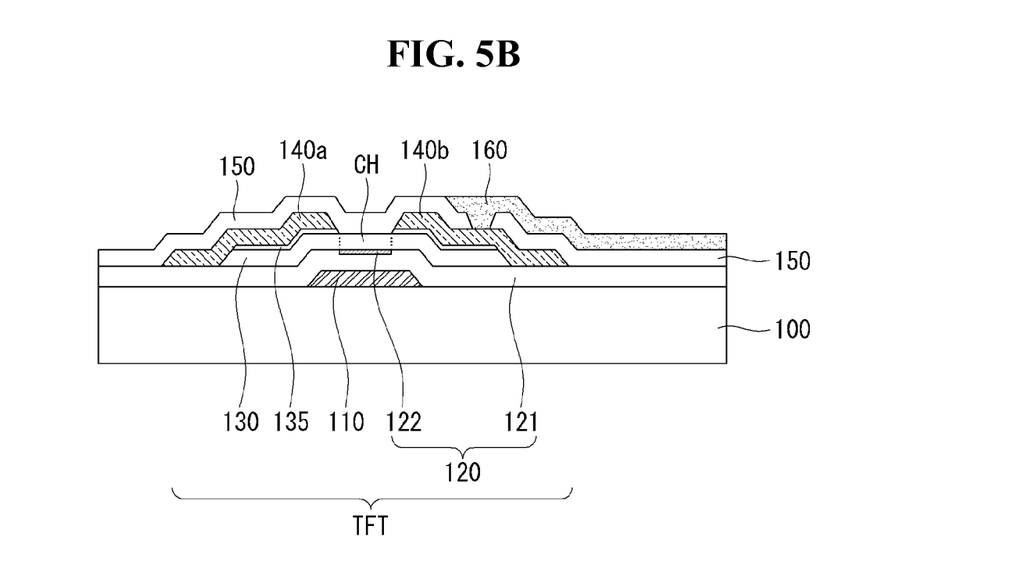

FIGS. 5A and 5B illustrate a structure of the phosphorus-doped layer according to the embodiment of the invention.

In the structure of the TFT array substrate shown in FIG. 1, the phosphorus-doped layer 122 may be formed on a whole surface of the gate insulating layer 120. On the other hand, as shown in FIG. 5A, the phosphorus-doped layer 122 may be formed only on a portion of the gate insulating layer 120 contacting the active layer 130. In this instance, the phosphorus-doped layer 122 has the same area as the active layer 130 and contacts the active layer 130.

Alternatively, as shown in FIG. 5B, the phosphorus-doped layer 122 may be formed only on a portion of the gate insulating layer 120 contacting a channel CH of the active layer 130. In this instance, the phosphorus-doped layer 122 has the same area as the channel CH of the active layer 130 and contacts the channel CH of the active layer 130. Because the phosphorus-doped layer 122 is used to obstruct the flow of holes at the channel CH of the active layer 130, the off-current may be reduced as long as the phosphorus-doped layer 122 contacts the channel CH of the active layer 130.

A method for manufacturing the TFT array substrate according to the embodiment of the invention is described below.

FIGS. 6A to 6G are cross-sectional views sequentially illustrating each of stage in a method for manufacturing the TFT array substrate according to the embodiment of the invention.

Figure 6A:
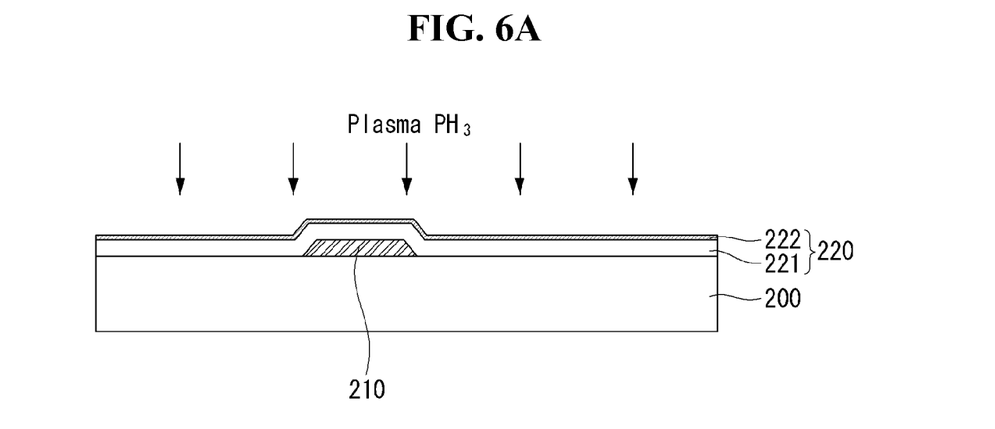
FIGS. 6A to 6G are cross-sectional views sequentially illustrating each of stage in a method for manufacturing a thin film transistor array substrate according to an example embodiment of the invention.

As shown in FIG. 6A, a metal layer of a low resistance is stacked on a substrate 200 formed of glass, plastic, or metal. For example, the metal layer of the low resistance may use chrome (Cr), molybdenum (Mo), aluminum (Al), titanium (Ti), gold (Au), silver (Ag), and copper (Cu). Subsequently, the metal layer is patterned using a photolithography process to form a gate electrode 210.

Next, a gate insulating layer 220 is formed on the substrate 200, on which the gate electrode 210 is formed. The gate insulating layer 220 electrically insulates the gate electrode 210 and may include a silicon oxide (SiOx) layer, a silicon nitride (SiNx) layer, or a double layer thereof.

Next, a plasma treatment is performed on the surface of the gate insulating layer 220 to dope the surface of the gate insulating layer 220 with phosphorus (P) at a predetermined concentration. The plasma treatment for doping the surface of the gate insulating layer 220 with phosphorus (P) is performed, so that the gate insulating layer 220 is not damaged by the plasma treatment.

The plasma treatment is performed at a temperature of about 400 to 800° C., a pressure of about 0.01 to 4.00 Torr, and power of about 50 to 900 W and uses $PH_3$ gas using argon (Ar) gas, helium (He) gas, or nitrogen ($N_2$) gas as a carrier gas. A concentration of phosphorus (P) doped on the surface of the gate insulating layer 220 may be about $10^{17}$ to $10^{21}/cm^3$. Phosphorus (P) doped on the surface of the gate insulating layer 220 is diffused into the gate insulating layer 220 in a subsequent thermal process without an additional process to form a phosphorus-doped layer 222. The gate insulating layer 220, into which phosphorus (P) is not diffused, serves as an insulating layer 221. The insulating layer 221 is formed of silicon nitride or silicon oxide. Hence, the gate insulating layer 220 includes the phosphorus-doped layer 222 and the insulating layer 221 underlying the phosphorus-doped layer 222.

Figure 6B:
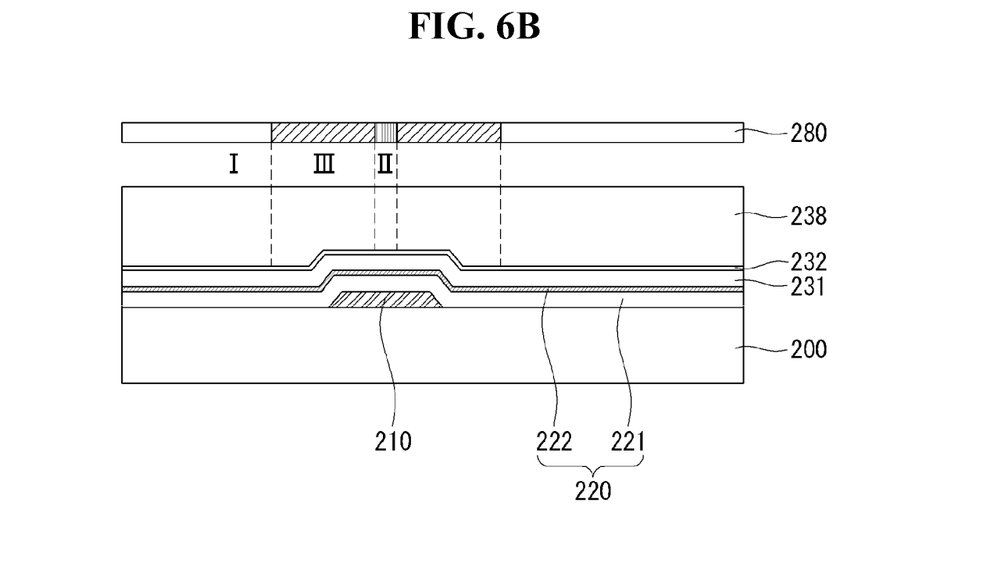

Next, as shown in FIG. 6B, an amorphous silicon layer 231 and an $n^+$-type amorphous silicon layer 232 are sequentially stacked on the gate insulating layer 220, in which the phosphorus-doped layer 222 is formed. The amorphous silicon layer 231 serves as an active layer, and the $n^+$-type amorphous silicon layer 232 serves as an ohmic contact layer.

A photosensitive layer 238 formed of a photosensitive material, such as a photoresist, is applied to the $n^+$-type amorphous silicon layer 232, and then light is selectively irradiated onto the photosensitive layer 238 using a halftone mask 280. For this, the halftone mask 280 includes a transmission part I for entirely transmitting the irradiated light, a semipermeable part II which transmits a portion of the irradiated light and blocks a portion of the irradiated light, and a block part III for entirely blocking the irradiated light. Light transmitted by the halftone mask 280 is irradiated onto the photosensitive layer 238.

Figure 6C:
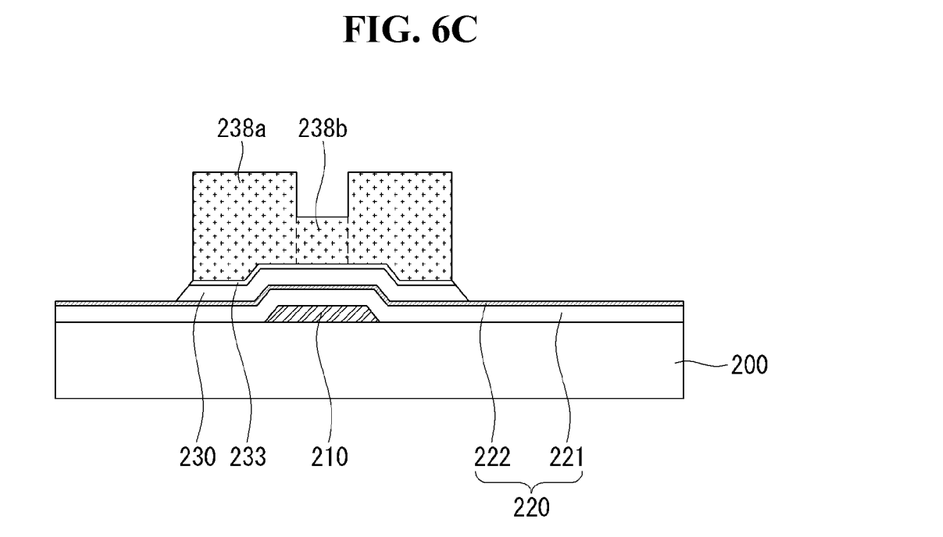

Next, as shown in FIG. 6C, when the photosensitive layer 238 exposed through the halftone mask 280 is developed, a first photosensitive pattern 238a of a predetermined thickness and a second photosensitive pattern 238b of a predetermined thickness remain in an area of the photosensitive layer 238, in which the light is entirely blocked or partially blocked by the block part III and the semipermeable part II of the halftone mask 280. Further, the photosensitive layer 238 is completely removed in the transmission part I for entirely transmitting the irradiated light, and thus the surface of the $n^+$-type amorphous silicon layer 232 is exposed.

A thickness of the first photosensitive pattern 238a formed through the block part III of the halftone mask 280 is greater than a thickness of the second photosensitive pattern 238b formed through the semipermeable part II of the halftone mask 280. The photosensitive layer 238 is completely removed in an area of the photosensitive layer 238 corresponding to the transmission part I for entirely transmitting the light, because a positive photoresist is used. The embodiment of the invention is not limited thereto. For example, a negative photoresist may be used.

Next, the amorphous silicon layer 231 and the $n^+$-type amorphous silicon layer 232 underlying the first and second photosensitive patterns 238a and 238b are selectively removed using the first and second photosensitive patterns 238a and 238b thus formed as a mask. Hence, an active layer 230 formed of amorphous silicon is formed on the gate insulating layer 220.

In this instance, an $n^+$-type amorphous silicon pattern 233 is formed on the active layer 230. The $n^+$-type amorphous silicon pattern 233 is formed of the $n^+$-type amorphous silicon layer 232 and is patterned in the same form as the active layer 230.

Figure 6D:
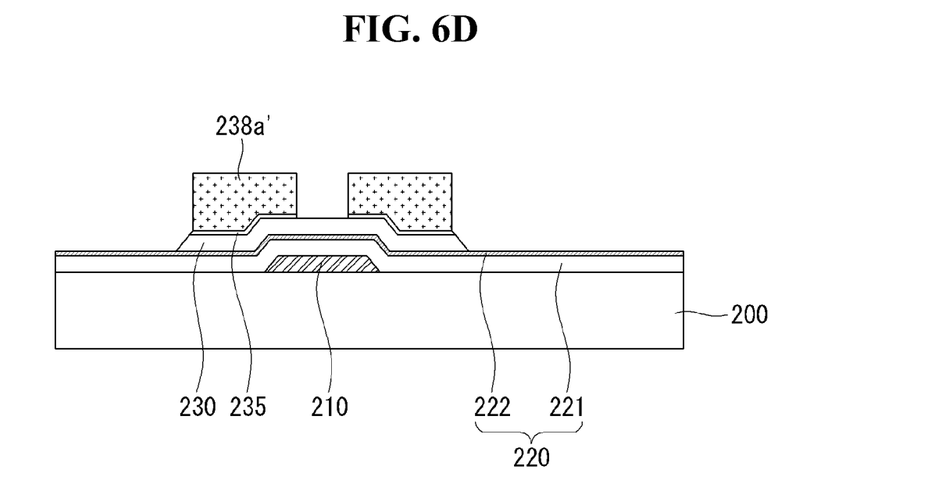

Next, as shown in FIG. 6D, an ashing process is performed to remove a portion of each of the first and second photosensitive patterns 238a and 238b. Hence, the second photosensitive pattern 238b formed through the semipermeable part II of the halftone mask 280 is completely removed. In this instance, the photosensitive layer 238 (i.e., the first photosensitive pattern 238a), in which the second photosensitive pattern 238b is removed, is formed as a third photosensitive pattern 238a'. The third photosensitive pattern 238a' remains as a source electrode region and a drain electrode region corresponding to the block part III.

Figure 6E:
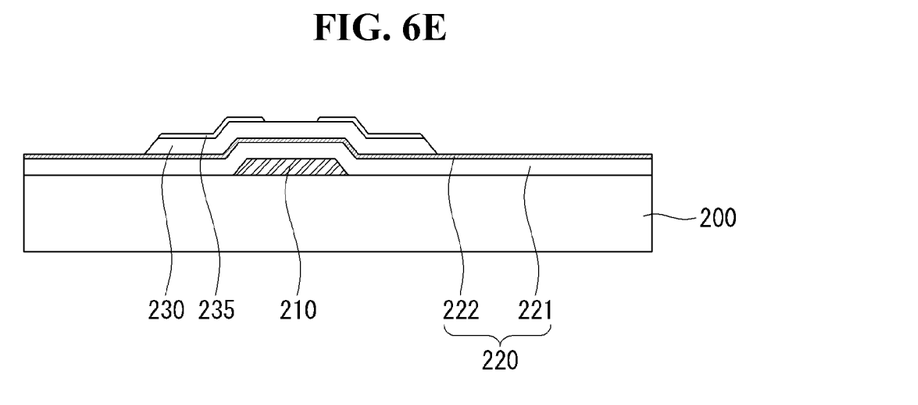

A portion of the $n^+$-type amorphous silicon pattern 233 is removed using the third photosensitive pattern 238a' as a mask to form an ohmic contact layer 235 on the active layer 230. The ohmic contact layer 235 is formed of the $n^+$-type amorphous silicon layer 232 and ohmic-contacts between the active layer 230 and the source and drain electrode regions. Next, as shown in FIG. 6E, the third photosensitive pattern 238a' is removed to finally form the active layer 230 and the ohmic contact layer 235.

Figure 6F:
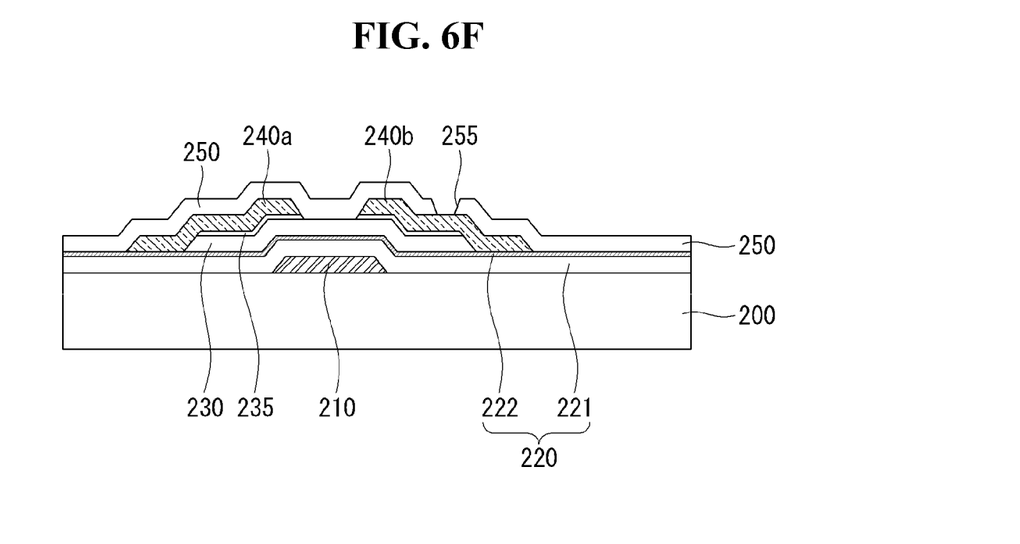

Next, as shown in FIG. 6F, a metal layer of a low resistance is stacked on the substrate 200. For example, the metal layer of the low resistance may use chrome (Cr), molybdenum (Mo), aluminum (Al), titanium (Ti), gold (Au), silver (Ag), and copper (Cu). Subsequently, the metal layer is patterned using a photolithography process to form a source electrode 240a and a drain electrode 204b.

Next, a passivation layer 250 is formed on a whole surface of the substrate 200, on which the source electrode 240a and the drain electrode 204b are formed. The passivation layer 250 may include a silicon oxide (SiOx) layer, a silicon nitride (SiNx) layer, or a double layer thereof in the same manner as the gate insulating layer 220. Alternatively, the passivation layer 250 may be formed of an organic insulating layer, for example, photoacrylic. Subsequently, a portion of the passivation layer 250 is etched to form a via hole 255 expositing the drain electrode 204b.

Figure 6G:
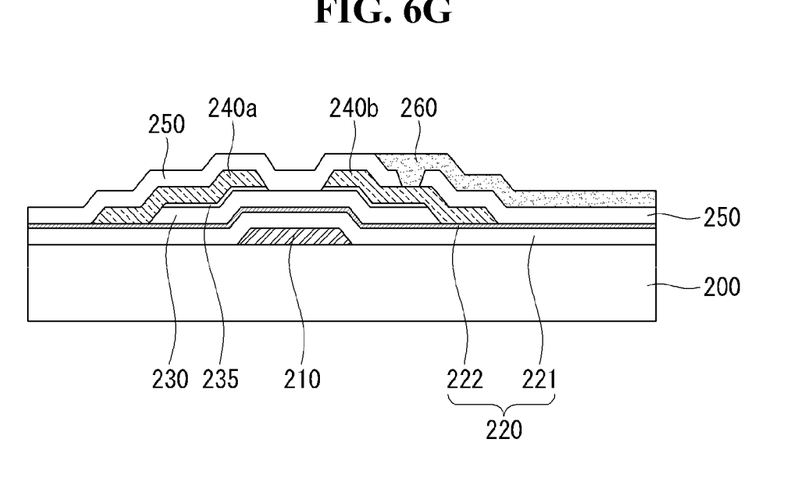

Next, as shown in FIG. 6G, a transparent conductive layer formed of a transparent conductive material is formed on the whole surface of the substrate 200, in which the via hole 255 is formed, and then is patterned to form a pixel electrode 260 connected to the drain electrode 240b through the via hole 255.

As described above, the method for manufacturing the TFT array substrate according to the embodiment of the invention may form the phosphorus-doped layer on the surface of the gate insulating layer through the plasma treatment. In the embodiment of the invention, after the gate insulating layer is formed, the phosphorus-doped layer is formed on the surface of the gate insulating layer through the plasma treatment. Alternatively, phosphorus (P) may be added to the gate insulating layer in the process for forming the gate insulating layer to form the phosphorus-doped layer. Further, in the embodiment of the invention, the active layer and the ohmic contact layer are simultaneously formed using the halftone mask. Alternatively, the source electrode and the drain electrode in addition to the active layer and the ohmic contact layer may be simultaneously formed using the halftone mask.

An experimental example of the thin film transistor manufactured according to the embodiment of the invention is described below. The following experimental example is one example for describing the embodiment of the invention, and thus the embodiment of the invention is not limited thereto.

EXPERIMENTAL EXAMPLE

Molybdenum (Mo) was deposited on a substrate using a sputter to form a gate electrode, and silicon nitride (SiNx) was deposited on the substrate at 300° C. using a plasma enhanced chemical vapor deposition (PECVD) to form a gate insulating layer. A phosphorus (P) doping process using $PH_3$ gas was performed on the gate insulating layer under the condition of a temperature of about 400° C., a pressure of about 1.00 Torr, and power of about 200 W to form a phosphorus-doped layer. Subsequently, an amorphous silicon layer and an $n^+$-type amorphous silicon layer were sequentially stacked on the gate insulating layer, in which the phosphorus-doped layer was formed. The amorphous silicon layer and the $n^+$-type amorphous silicon layer were patterned using a halftone mask to form an active layer and an ohmic contact layer. Molybdenum (Mo) was deposited on the substrate using the sputter to form a source electrode and a drain electrode. Hence, a thin film transistor of an experimental example according to the embodiment of the invention was completed.

COMPARATIVE EXAMPLE

A thin film transistor according to a comparative example was manufactured in the same manner as the above experimental example, except the formation of the phosphorus-doped layer.

Figure 7:
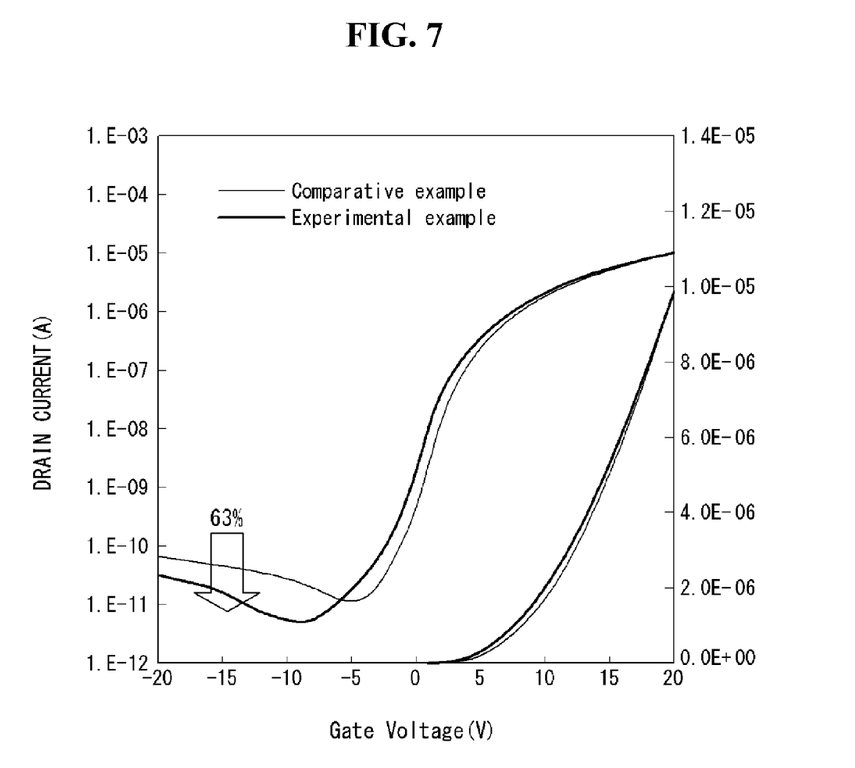
FIG. 7 is a graph indicating on-current and off-current characteristics of a thin film transistor manufactured based on each of an experimental example according to an example embodiment of the invention and a comparative example.

FIG. 7 illustrates On and Off characteristics of the thin film transistor manufactured based on each of the experimental example according to the embodiment of the invention and the comparative example.

As shown in FIG. 7, in the thin film transistor according to the comparative example, when a gate voltage was turned off, a large amount of drain current was generated. On the other hand, in the thin film transistor of the experimental example according to the embodiment of the invention, when the gate voltage was turned off, the drain current was reduced by about 63% of the drain current of the comparative example.

As described above, the TFT array substrate according to the embodiment of the invention and the method for manufacturing the same form the phosphorus-doped layer between the active layer and the gate insulating layer, thereby reducing the off-current of the thin film transistor and the leakage current of the thin film transistor. Hence, the embodiment of the invention may provide the thin film transistor having the excellent electrical characteristics.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a thin film transistor array substrate comprising:

forming a gate electrode on a substrate;
forming a gate insulating layer on the gate electrode;
doping phosphorus (P) on the gate insulating layer to form a phosphorus-doped layer;
forming an active layer and an ohmic contact layer on the gate insulating layer; and
forming a source electrode and a drain electrode which are respectively connected to both sides of the active layer through the ohmic contact layer.

2. The method of claim 1, wherein a thickness of the phosphorus-doped layer is equal to or less than about 300 Å measured from the surface of the gate insulating layer.

3. The method of claim 1, wherein a doping concentration of phosphorus (P) contained in the phosphorus-doped layer is about $10^{17}$ to $10^{21}/cm^3$.

4. The method of claim 1, wherein the active layer and the ohmic contact layer are formed using a halftone mask.

5. The method of claim 1, wherein the phosphorus-doped layer has the same area as the active layer and contacts the active layer.

6. The method of claim 1, wherein the phosphorus-doped layer has the same area as a channel of the active layer and contacts the channel of the active layer.

7. The method of claim 1, wherein the phosphorus-doped layer is positioned on a whole surface of the gate insulating layer.

8. The method of claim 1, further comprising forming a pixel electrode connected to one of the source electrode and the drain electrode.

9. A thin film transistor array substrate comprising:

a substrate;
a gate electrode positioned on the substrate;
a gate insulating layer positioned on the gate electrode;
an active layer positioned on the gate insulating layer, the active layer including a channel;
an ohmic contact layer positioned on the active layer; and
a source electrode and a drain electrode which are respectively connected to both sides of the active layer through the ohmic contact layer,
wherein the gate insulating layer includes a phosphorus-doped layer positioned adjacent to the active layer.

10. The thin film transistor array substrate of claim 9, wherein a thickness of the phosphorus-doped layer is equal to or less than about 300 Å measured from the surface of the gate insulating layer.

11. The thin film transistor array substrate of claim 9, wherein a doping concentration of phosphorus (P) contained in the phosphorus-doped layer is about $10^{17}$ to $10^{21}/cm^3$.

12. The thin film transistor array substrate of claim 9, wherein the phosphorus-doped layer has the same area as the active layer and contacts the active layer.

13. The thin film transistor array substrate of claim 9, wherein the phosphorus-doped layer has the same area as the channel of the active layer and contacts the channel of the active layer.

14. The thin film transistor array substrate of claim 1, wherein the phosphorus-doped layer is positioned on a whole surface of the gate insulating layer.

15. The thin film transistor array substrate of claim 1, further comprising a pixel electrode connected to one of the source electrode and the drain electrode.

* * * * *